United States Patent [19]

Dzwonczyk

[11] Patent Number: 5,091,824
[45] Date of Patent: Feb. 25, 1992

[54] HOLD DOWN INTERCONNECTION STICK

[75] Inventor: Luke Dzwonczyk, Marlborough, Mass.

[73] Assignee: The United States of America as represented by the Secretary of the Navy, Washington, D.C.

[21] Appl. No.: 502,969

[22] Filed: Apr. 2, 1990

[51] Int. Cl.⁵ .............................................. H05K 7/20
[52] U.S. Cl. .................................. 361/385; 165/80.4; 361/415
[58] Field of Search ................ 439/76, 485; 165/80.3, 165/80.4, 104.33, 185; 361/380, 382, 385, 386, 387, 388, 395, 396, 412, 413, 415

[56] References Cited

U.S. PATENT DOCUMENTS

| | | | |
|---|---|---|---|
| 4,657,325 | 4/1987 | Marks | 361/388 |
| 4,953,058 | 8/1990 | Harris | 361/383 |
| 5,019,940 | 5/1991 | Clemens | 361/386 |

Primary Examiner—Gerald P. Tolin
Attorney, Agent, or Firm—Michael L. McGowan; Prithvi C. Lall; Michael F. Oglo

[57] ABSTRACT

A hold down interconnection stick is provided which is fastened to the outer walls of a container of an electronic system and to the electronic printed circuit boards which form a part of the electronic system. The stick is also provided with heat dissipating means to carry away the heat generated during the operation of the electronic system so as to enable the electronic components function within their tolerances of temperature. The fastening means provide a vibration-free system and thus reduces any vibration-induced noise.

4 Claims, 2 Drawing Sheets

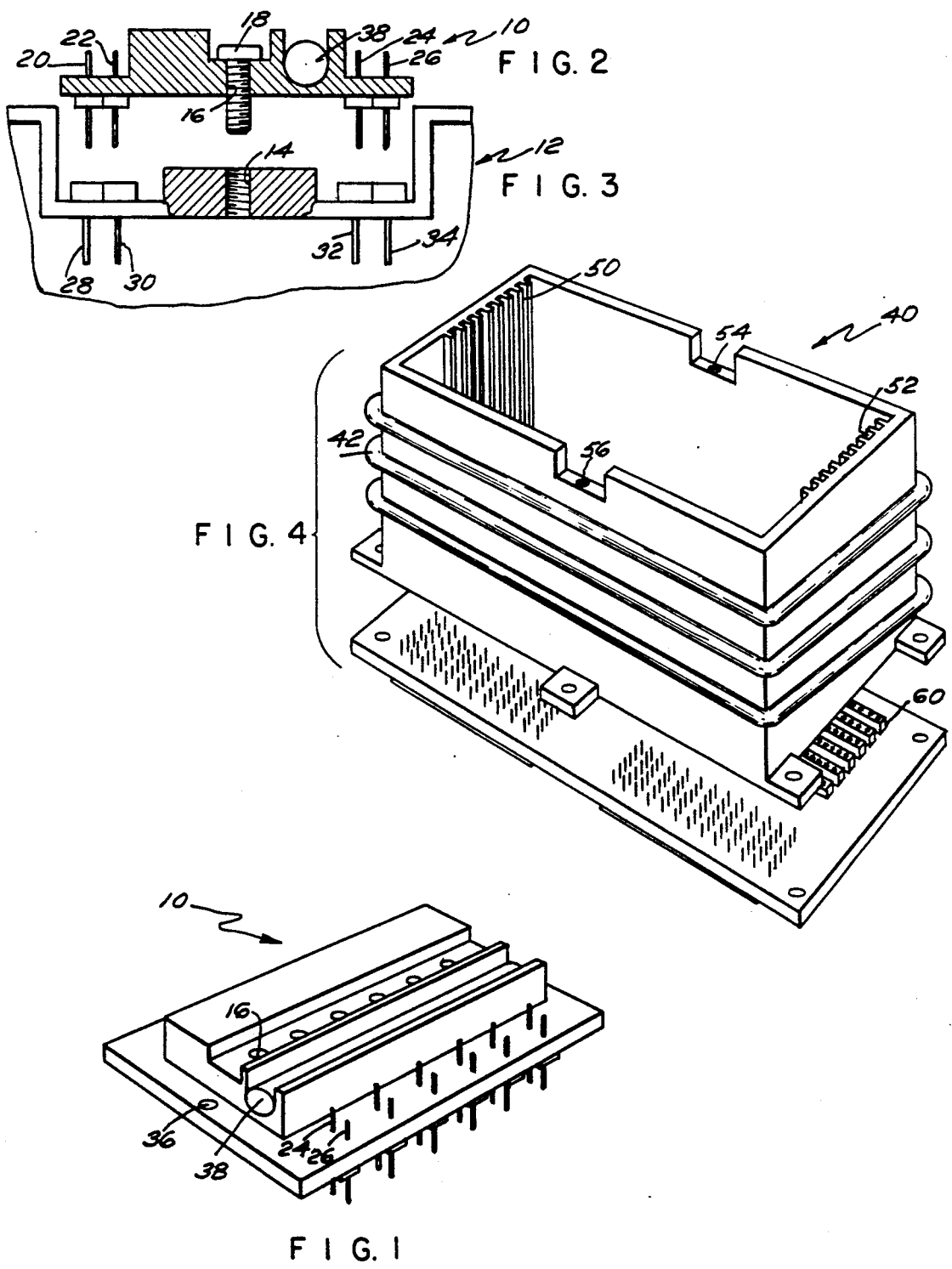

HOLD DOWN INTERCONNECTION STICK

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

Subject invention is related to electronic systems where many subsystems are interconnected and more particularly to a device which is used to interconnect firmly and thus make a positive connection between various circuit boards in an electronic system and prevent overheating of the components.

(2) Description of the Prior Art

Electronic systems are essential for many devices in various areas of technology and they are made of many subsystems interconnected together. It is imperative for the proper functioning of such a system that all the subsystems are positively connected to one another and adequate heat dissipation of the heat generated during their operation is provided to minimize their malfunctioning. Efforts have been made to provide cooling fans to dissipate the heat generated. However, such fans produce their own electric noise which interferes with the electronic pulses carrying useful information and thus impairs their accuracy. Furthermore, the vibrations caused by cooling fans can also loosen the mechanical connections between the circuit boards and the chassis and thus increase the chances of malfunctioning of the electronic system. It is thus desirable to have a device which provides a positive mechanical connection between various circuit boards and the chassis and also dissipates effectively the heat generated during the operation of various electronic components.

SUMMARY OF THE INVENTION

Accordingly, the present invention provides a positive mechanical connection between various electronic subcircuits or modules and facilitates vibration reduction and dissipation of heat which is produced during their operation. It provides a stick with contact pins, wiring; hardware and locating pins which plugs into the top of a set of modules or printed circuit boards. The stick also conducts heat from the center of the module by means of solid metal conductor or by means of a heat pipe embedded in the stick.

An object of subject invention is to provide a positive connection between various modules or circuit subgroups of an electronic system.

Another object of subject invention is to reduce the vibration-induced noise in processing electrical signals by the electronic system.

Still another object of subject invention is to provide a strong mechanical support to various modules of the electronic system.

An additional object of subject invention is to provide a mode for dissipation of heat generated during the operation of the electronic system.

Other objects, advantages and novel features of the invention may become apparent from the following detailed description when considered in conjunction with the accompanying drawings wherein:

BRIEF DESCRIPTION OF THE DRAWINGS

FIG. 1 is a schematic representation of the device according to the teachings of subject invention;

FIG. 2 is a cross-sectional view of the hold down interconnection stick of FIG. 1;

FIG. 3 is a cross-sectional view of the module in to which the hold down interconnection stick is interconnected;

FIG. 4 schematically shows how the modules of the electronic system are held together by the hold down interconnection stick to form a vibration free positive interconnection arrangement, and;

DESCRIPTION OF THE PREFERRED EMBODIMENT

Figure 5:
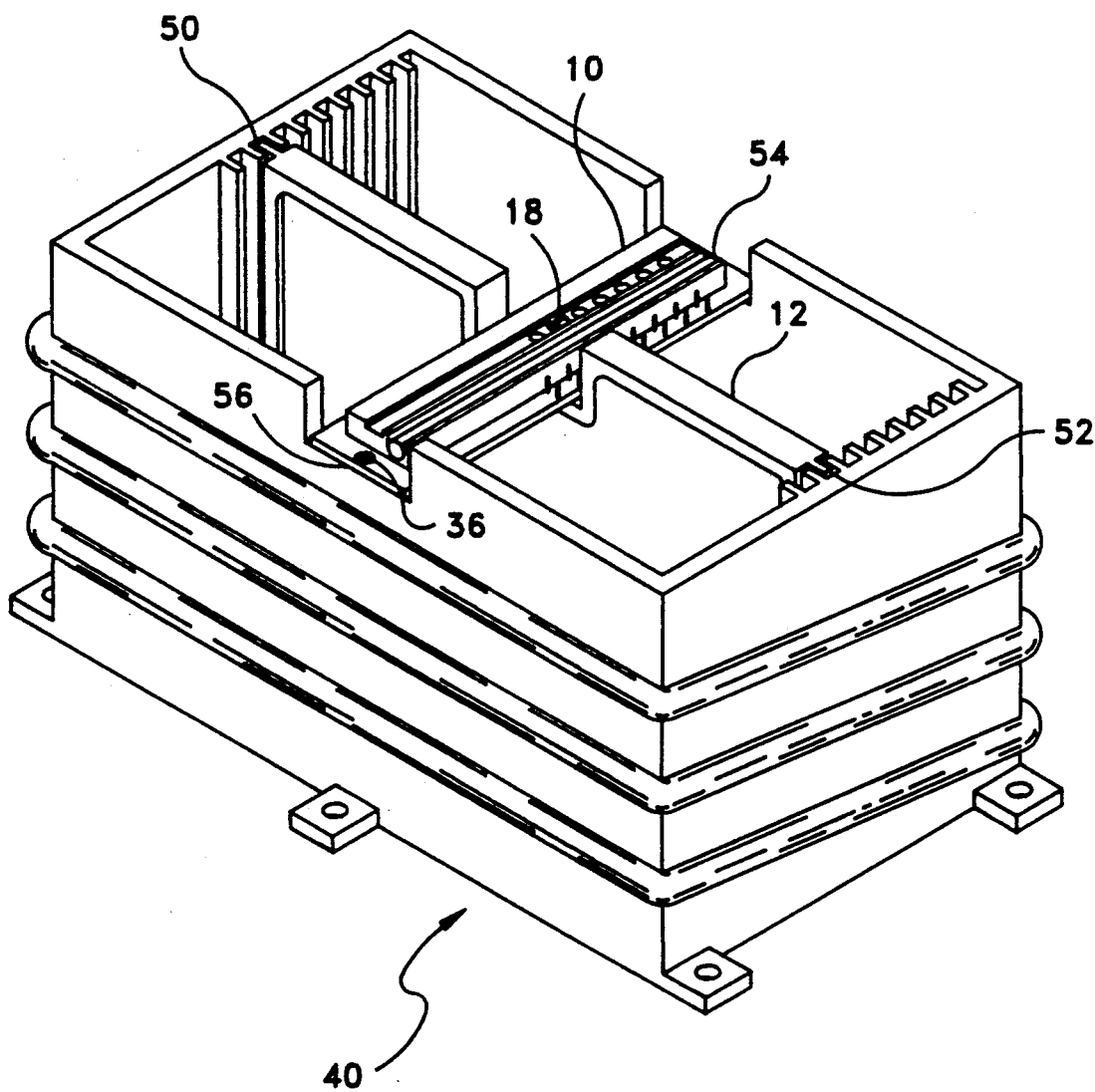
FIG. 5 is a perspective view of the hold down stick in place in an electronic system.

FIG. 1 is a representation of the hold down interconnection stick 10 according to the teachings of subject invention wherein like numbers represent like parts throughout the drawings.

FIG. 2 represents a cross-sectional view of hold down interconnection stick 10 of FIG. 1 and FIG. 2 which includes pins 20, 22, 24, 26 which mate with the corresponding pins 28, 30, 32, 34 in module 12. Threaded portions 14 and 16 of fasteners such as 18 in the module 12 and device 10 mate together so as to provide a positive mechanical interconnection which is more or less vibration free. A heat pipe 38 is provided in device 10 to conduct heat generated during the operation of the electronic circuits to the edges and thus keep the electronic components relatively cool. FIG. 4 diagrammatically illustrates the electronic system 40 in an assembled form where each of the modules such as 12 of FIG. 3 is guided into slots 50 and 52 and the hold down interconnection stick 10 of FIGS. 1 and 2 is secured to the outside walls by means of fasteners 54 and 56 and to the modules by fasteners such as 36 of FIG. 1 and the bottom 60 the chassis of the electronic system with power pins to energize the modules. A cooling arrangement 42 is provided to carry the heat generated by the operation of electronic system which is transferred to the outside walls of the electronic system. FIG. 5 is a perspective view of all components including the hold down stick 10, module 12 in place in the electronic system 40. The electronic system thus assembled operates as a vibration free unit and at temperatures well below the tolerance levels of the electronic components. It should be understood that subject embodiment is shown and described by way of illustration only and not as a way of limitations.

Briefly stated, a hold down interconnection stick, for securing various electronic modules in an electronic system so as to reduce vibration induced noise and to dissipate the heat includes means for securing the stick to the electronic modules and the outer walls of the container of the electronic system. The stick is also provided with a heat pipe to carry the heat generated to the edges of the outer walls and thus keeps the temperature of the electronic components within the range of their tolerances.

Many modifications and variations are possible to practice subject inventive concept without deviating from the teachings of subject invention. As an example, a heat pipe in the hold down interconnection stick can be replaced by a solid conductive bar embedded therein. Furthermore, different types of fasteners may be used to secure the stick to the outer walls of the container of the electronic system and to the electronic modules at the same time. It is therefore understood that within the scope of the appended claims, the invention may be practiced otherwise than specifically described.

What is claimed is:

1. In an electronic system a housing containing a plurality of modules of printed circuit boards each member thereof having electronic components and a power pin thereon and said boards placed longitudinally parallel to one another inside said housing in respective slots along the opposite sides of said housing and said housing provided with power means on a bottom surface thereof to power said printed circuit boards, an improved hold down interconnection stick making a vibration-free positive connection between said printed circuit boards and dissipating heat generated by the electronic components of each of said plurality of printed circuit boards, said hold-down interconnection stick comprises:

a bar secured at the ends thereof to said container at the longitudinal walls thereof;

a plurality of pins on said bar mating with corresponding pins of each of said plurality of printed circuit boards and power pins thereon; means securing each of said plurality of printed circuit boards with said bar; and heat conducting means on the hold-down stick carrying the heat generated by the powered electronic components of said plurality of printed circuit boards.

2. The hold down interconnection stick of claim 1 wherein said heat conducting means includes a heat pipe for carrying the heat generated by the electronic components of said plurality of modules to the outside walls of said housing for dissipation.

3. The hold down interconnection stick of claim 1 wherein said means for securing each of said plurality of modules of printed circuit boards to said hold down interconnection stick includes a plurality of fasteners wherein each member thereof secures said bar to a corresponding member of said plurality of printed circuit boards.

4. The hold down interconnection stick of claim 3 which includes a pair of fasteners to secure said bar at the ends thereof to said housing at the outerwalls thereof.

* * * * *